United States Patent
Chun et al.

(10) Patent No.: US 6,321,367 B1
(45) Date of Patent: Nov. 20, 2001

(54) APPARATUS AND METHOD FOR AUTOMATICALLY GENERATING CIRCUIT LAYOUTS

(75) Inventors: Perry Chun, Milpitas; Richard C. Saito, Sunnyvale; Y. Eugene Chen, San Jose, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 08/914,847

(22) Filed: Aug. 18, 1997

Related U.S. Application Data
(60) Provisional application No. 60/024,948, filed on Aug. 30, 1996.

(51) Int. Cl.$^7$ .................................................. G06F 17/50
(52) U.S. Cl. ................................................. 716/8; 716/11
(58) Field of Search ........................... 364/489, 490, 364/491; 395/500; 716/1, 2, 3, 8, 11, 18

(56) References Cited

U.S. PATENT DOCUMENTS

| | | | |
|---|---|---|---|
| 4,651,284 * | 3/1987 | Watanabe et al. | 364/491 |
| 4,745,084 * | 5/1988 | Rowson et al. | 437/51 |
| 5,031,111 * | 7/1991 | Chao et al. | 364/491 |
| 5,050,091 * | 9/1991 | Rubin | 364/488 |
| 5,365,454 * | 11/1994 | Nakagawa et al. | 364/401 |
| 5,402,358 * | 3/1995 | Smith et al. | 364/490 |
| 5,473,547 * | 12/1995 | Muroga | 364/489 |
| 5,619,420 * | 4/1997 | Breid | 364/491 |
| 5,633,805 * | 5/1997 | Simonsen | 364/490 |
| 5,666,288 * | 9/1997 | Jones et al. | 364/400 |
| 5,689,432 * | 11/1997 | Blaauw et al. | 364/400 |
| 5,764,533 * | 6/1998 | Dedood | 364/491 |
| 5,802,349 * | 9/1998 | Rigg et al. | 395/500 |
| 5,898,595 * | 4/1999 | Bair et al. | 364/491 |
| 5,983,008 * | 11/1999 | Kumashiro et al. | 395/500.07 |
| 5,984,510 * | 11/1999 | Guruswamy et al. | 364/401 |
| 5,995,734 * | 11/1999 | Saika | 395/500.1 |

OTHER PUBLICATIONS

Onodera et al. "P2Lib: Process–Portable Library and Its Generation System," IEEE 1997 Custom Integrated Circuits Conference, pp. 341–344, 1997.*

* cited by examiner

Primary Examiner—Paul R. Lintz
Assistant Examiner—Leigh Marie Garbowski
(74) Attorney, Agent, or Firm—Pennie & Edmonds LLP

(57) ABSTRACT

A method of automatically generating a custom device layout includes the step of specifying a device type and an associated set of device parameters. The device type is then matched to a selected cell in a cell library. Physical layout regions of the selected cell are then selectively modified in accordance with the device parameters. The physical layout regions may also be selectively modified in accordance with technology design rules in a design rule library. The physical layout regions of the selected cell are then drawn.

12 Claims, 6 Drawing Sheets

Data From Cell Library

W = 1.1   L = 0.55

Stretch Data Along Horizontal Axis

W = 1.1   L = 1.5

Stretch Data Along Vertical Axis

W = 4.0   L = 1.5oM

Remove Temporary Layers

W = 4.0   L = 1.5

Add In Maximum Allowable Number of Contacts

W = 4.0   L = 1.5

Label Ports

W = 4.0   L = 1.5

Place Final Product

W = 4.0   L = 1.5

APPARATUS AND METHOD FOR AUTOMATICALLY GENERATING CIRCUIT LAYOUTS

This application claims priority to the provisional application entitled "Apparatus and Method for Automatically Generating A Custom Transistor Layout", Ser. No. 60/024,948, filed Aug. 30, 1996.

BRIEF DESCRIPTION OF THE INVENTION

This invention relates generally to the design of integrated circuits. More particularly, this invention relates to a technique for improving the design process for integrated circuits through an automated custom transistor layout system.

BACKGROUND OF THE INVENTION

When designing an integrated circuit, a designer will use various electronic design automation (EDA) tools to describe the elements and functions that will be incorporated into the integrated circuit. For example, the designer may use a hardware description language, such as VHDL. A hardware description language allows the designer to describe the functions that are to be performed by the integrated circuit, without specifying the elements used to perform the functions. Software tools are available to translate the hardware description language into a gate level design that implements the specified functions. Alternatively, the designer may enter the gate level design directly. For example, drawing tools are available for entering gate level designs. Such designs may be represented by a schematic that has symbols to identify each element in a design. In the schematic, every element is represented by a symbol. Generation of the schematic may be accomplished manually or automatically.

In order to fabricate the integrated circuit, the schematic is translated into a physical layout. The physical layout is a description of how the design will be fabricated in the actual device. In other words, it is a physical representation of the elements in the schematic. Generating a physical layout is a time consuming process. Electronic design automation tools exist to generate a physical transistor layout with uniform gates. These types of gates are known as standard cells. However, in the case of non-standard cells, or custom cells, the layout engineer generates the physical transistor layout manually, for instance, by drawing it with a computer. For a typical integrated circuit, it may take months to generate a custom layout.

Thus, it would be highly desirable to improve the integrated circuit design process by providing a tool that can be used to automatically generate physical layouts for custom cells from a circuit schematic.

SUMMARY OF THE INVENTION

A method of automatically generating a custom device layout includes the step of specifying a device type and an associated set of device parameters. The device type is then matched to a selected cell in a cell library. Physical layout regions of the selected cell are then selectively modified in accordance with the device parameters. The physical layout regions may also be selectively modified in accordance with technology design rules in a design rule library. The physical layout regions of the selected cell are then drawn.

The invention provides an automated approach to generating custom transistor layouts. In the prior art, such layouts are generated manually. Thus, the invention reduces design time. The cell library includes a large variety of devices, such as low and medium voltage transistors, high voltage transistors, looped gate transistors, resistors, and other special devices. Thus, the invention is distinct from layout tools that are limited to generating standard transistor cells. In accordance with the invention, the specified transistor may be assigned an arbitrary size, consequently the cell library is not limited by device size.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
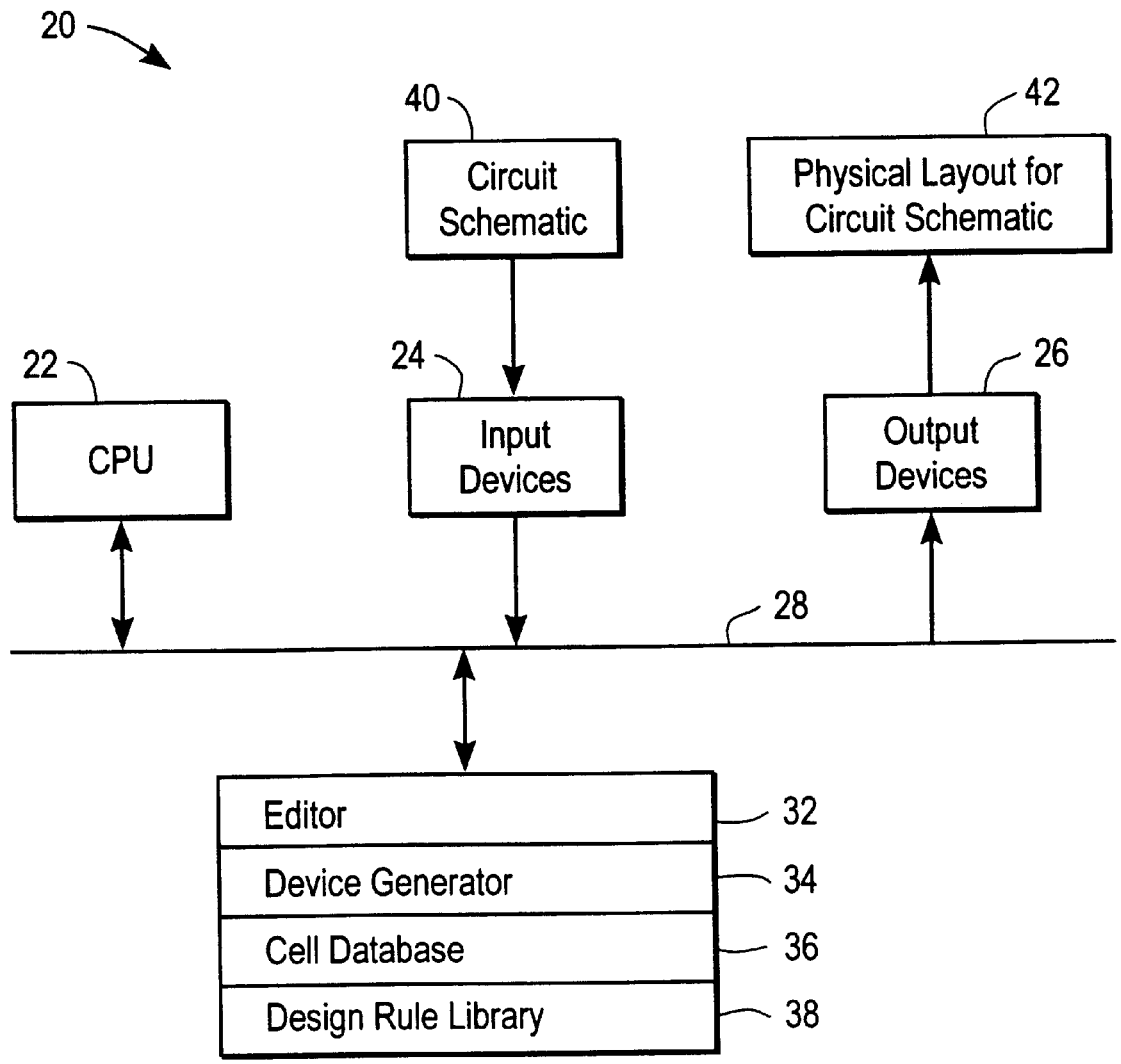
FIG. 1 illustrates an apparatus constructed in accordance with an embodiment of the invention.

FIG. 1 illustrates an electronic design automation apparatus 20 in accordance with the invention. The apparatus 20 includes a central processing unit that communicates with a set of input devices 24 and output devices 26 over a system bus 28. The CPU 22 also communicates with a memory 30 over the system bus 28. The interaction of a CPU 22, input devices 24, output devices 26, and a memory 30 is known in the art. The present invention is directed toward the execution of a set of programs stored in memory 30. The programs include an editor 32, which interacts with the input devices 24 to characterize a custom transistor. The device generator 34 receives the transistor information from the editor 32 and generates a custom physical layout for the transistor. The device generator 34 relies upon a cell library 36 to match the specified transistor with a library cell. In addition, the device generator 34 relies upon a design rule library 38 to insure that the transistor is drawn in accordance with technology design requirements.

The executable programs (32–38) of the invention allow a circuit schematic 40 received at the input devices 24 to be transformed into a physical layout 42, as generated by the output devices 26. The input devices 24 may include a keyboard, mouse, etc. The output devices 26 may include a computer monitor, printer, plotter, etc.

Figure 2:
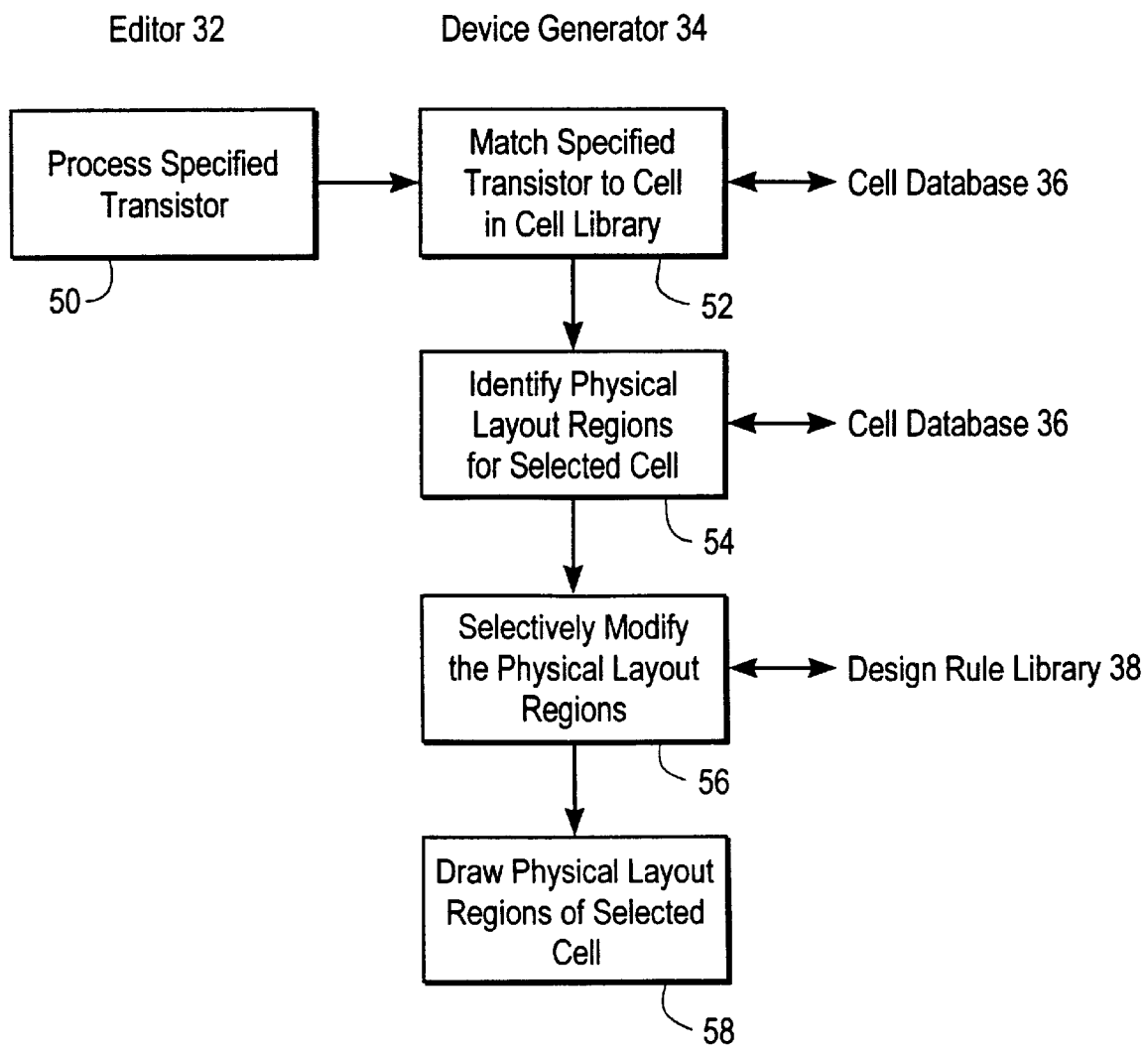
FIG. 2 illustrates processing steps associated with an embodiment of the invention.

The processing of the invention is more fully appreciated with reference to FIG. 2. FIG. 2 illustrates processing steps in blocks. The executable programs in memory that are used to perform the processing steps are also shown in FIG. 2. For example, FIG. 2 illustrates that the editor 32 is used to process a specified device. Preferably, the following command syntax is used in the editor:

devgen <device_type> <width> [/<length>] [M=(no_of_legs)] [INST=<instance_name>] [S=<source_name> G=<gate_name>D=<drain_name>] [RA=<resistor_terminal_a> RB=<resistor_terminal_b>] [(x-coord) (y-coord)].

The command "devgen" invokes the device generator 34. The term "device_type" specifies the type of device to be drawn. The "width" argument is the width of the device, while the "length" argument is the length of the device. If the length is omitted, the device generator 34 will assign a default value.

The "M" argument is the multiplier, or the number of polysilicon legs in the device. The device generator 34 uses a default value of 1 if this argument is not specified.

The "INST" argument, "S" argument, "G" argument, and "D" argument are used to specify text to be associated with the drawn device. The "INST" argument is used to specify the instance of the transistor, the "S", "G", and "D" arguments are respectively used to specify the source, gate and drain of the transistor.

Arguments are also provided for resistors. In particular, the arguments "RA" and "RB" are used to specify the nets connected to the resistor terminals. These values are used in place of the "S", "G", and "D" arguments.

The "X" and "Y" arguments are used to specify where the device should be drawn in an (x,y) coordinate grid. The use of selected arguments will be illustrated below in relation to several examples.

Returning to FIG. 2, the next processing step is to match the specified device to a cell in the cell library (step 52). This operation is performed by the device generator 34 in conjunction with the cell database 36. The cell database 36 includes a large number of custom devices including low and medium voltage transistors, high voltage transistors, looped gate transistors, and other special devices. Each device may be implemented in a variety of technologies, for instance 0.5 micron triple metal layer CMOS technology or 0.1 micron double metal layer CMOS technology. Based upon the technology used, different design rules may be applicable to the construction of the device. In particular, the different physical layout regions of the transistor must satisfy the design rules for the given technology. Thus, as shown in FIG. 2, the next processing step is to identify physical layout regions for the selected cell (step 54). This operation is also performed in conjunction with the cell database 36.

The next processing step associated with the invention is to selectively modify the physical layout regions of the specified device (step 56). As shown below, the modifications are based upon the parameters specified by the user and by the implementing technology. As shown in FIG. 2, this operation is performed in cooperation with the design rule library 38. By way of example, the design rule library 38 includes design rules specifying the minimum polysilicon width, the minimum polysilicon to polysilicon spacing, the minimum polysilicon to diffusion spacing, the minimum polysilicon overlap beyond a diffusion, etc. These parameters may change depending upon the device technology that is being implemented. Thus, the design rule library 38 includes design rules or technology design requirements for different technologies.

After the design rule library 38 is invoked, the physical layout regions for the selected cell may be drawn (step 58).

Figure 3:
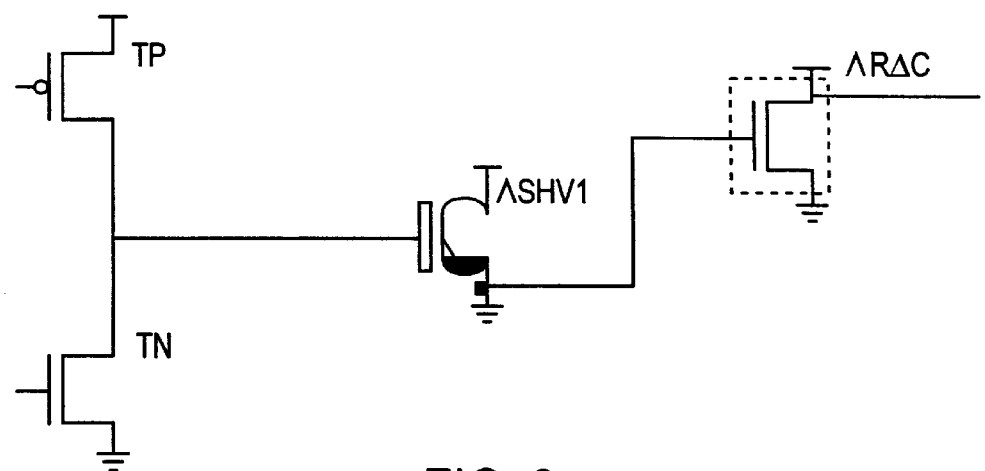
FIG. 3 illustrates a simple circuit schematic that may be processed in accordance with an embodiment of the invention.
Figure 4:
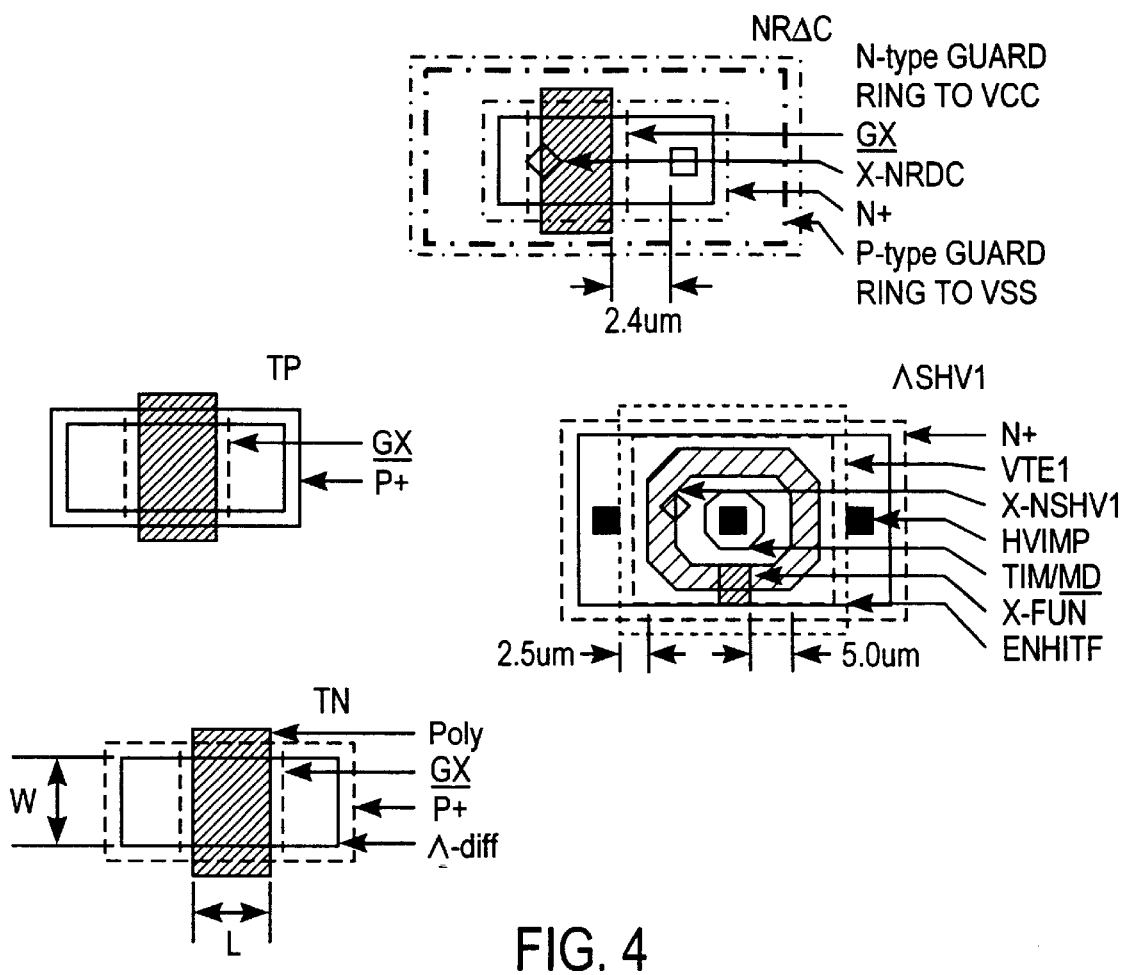
FIG. 4 illustrates a simplified representation of a custom physical transistor layout, corresponding to the circuit schematic of FIG. 3, constructed in accordance with an embodiment of the invention.

The foregoing operations are more fully appreciated with reference to a set of examples. FIG. 3 illustrates a schematic that may be processed in accordance with the invention. Typically, a schematic, such as the one shown in FIG. 3, is provided to a layout engineer, who manually generates a corresponding physical layout. However, in accordance with the invention, the layout can be generated using the previously described software modules. For example, to construct the TN transistor of FIG. 3 with a width (w) equal to 5.2 microns, a length (L) equal to 1.1 microns, a multiplier equal to 1, at the physical grid location (1,1), the following command would be used: devgen TN 5.2/1.1 m=1 (1,1). This command entered at the editor 32 invokes the device generator 34. The device generator 34 then performs processing steps 52–58 shown in FIG. 2. A simplified physical layout that does not depict connections between circuit elements is shown in FIG. 4. The device TN layout in FIG. 4 illustrates the width (W), length (L), polysilicon physical layout region, N+ physical layout region, N-diffusion physical layout region and the GX metal layer.

A similar command is used to construct the device TP. For example, the following command may be used: devgen TP 5.2/1.1 m=1 (1,5). This command is consistent with the previous command, but it specifies a different device and a different grid location. The resultant device is shown in FIG. 4.

The schematic of FIG. 3 includes a complicated looped gate transistor NSHV1. To construct this transistor, the following command is used: devgen NSHV1 8.2/1.3 m=1 (3,3). The resultant device is shown in FIG. 4. The layout of FIG. 4 indicates that a 5 micron contact-to-gate spacing on the source is required and a 2.5 micron contact-to-gate spacing on the drain is required. This information is available in the design rule library 38. Any modifications to the physical layout of the device will observe these design rules. The figure also shows metal layers VTE1, HVIMP, TIM/MD, and ENHITF. In addition, the figure shows the physical layout region N+, the device name NSHV1, and a label X-FUN.

The final element in FIG. 3 is the transistor NRDC, which is a relatively complicated device to draw manually. In accordance with the invention, the device is constructed with the following command: devgen NRDC 7/1 m=1 (5,5). The resultant device is shown in FIG. 4. Note that the contact must be 2.4 microns from the gate. This type of feature is very difficult to create manually. However, in accordance with the invention, this design requirement is known from the design rule library 38 and is automatically adhered to when drawing the device. The figure also shows an N-type guard ring to Vcc, a P-type guard ring to Vss, a metal layer GX, a label X-NRDC, and a physical layout region N+.

Figure 5A:
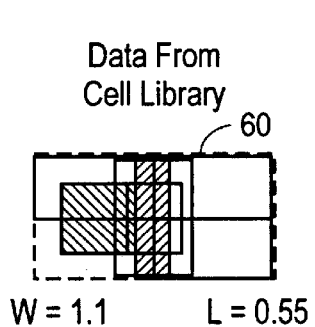
FIGS. 5(a)–5(g) illustrate the manipulation of a cell library template to achieve a desired transistor layout, in accordance with an embodiment of the invention.

The foregoing example illustrates a number of physical layout regions that must adhere to different design rules specified in the design rule library 38. The following example is used to demonstrate the selective modification of physical layout regions. Suppose the device generator 34 is requested to construct a TN transistor with a width (W) of 4, a length (L) of 1.5, and a multiplier value (M) of 1 to be drawn at a physical grid location of (0,0). The device generator 34 may be invoked from within the layout editor 32, or it can be called from the operating system's command line. Relying upon the syntax provided above, the command used to generate the layout would be: devgen TN 4.0/1.5 m=1 (1,1). The device generator 34 would then match the transistor "TN" to a transistor in the cell database 36 (step 52 of FIG. 2). Physical layout regions for the selected cell would then be identified (step 54 of FIG. 2). FIG. 5(a) illustrates a cell 60 corresponding to the "TN" transistor specified. In particular, FIG. 5(a) illustrates the physical layout regions associated with the transistor.

The next processing step associated with the invention is to selectively modify the physical layout regions of the device (step 56). That is, the device 60 of FIG. 5(a) is a template containing all the necessary layers for drawing the device, but it is drawn at a minimum size and in a general way. The parameters associated with the "devgen" command are used to modify the device. In particular, the parameters of device length, device width, and the multiplier are used to modify the device. Other parameters, such as instance name, "D", "S", and "G" are used to label the device. The grid location parameter is used to place the device at the specified grid location.

Figure 5B:
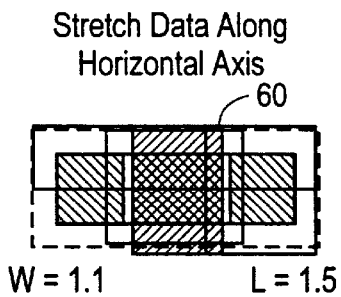
Figure 5C:
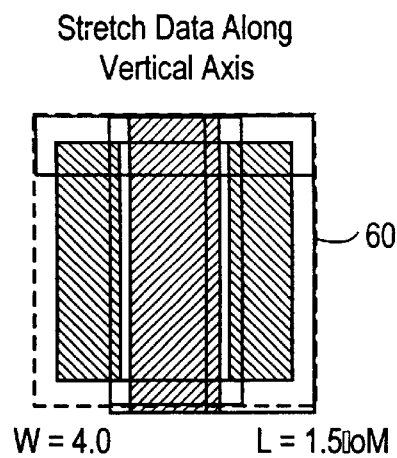
Figure 5D:
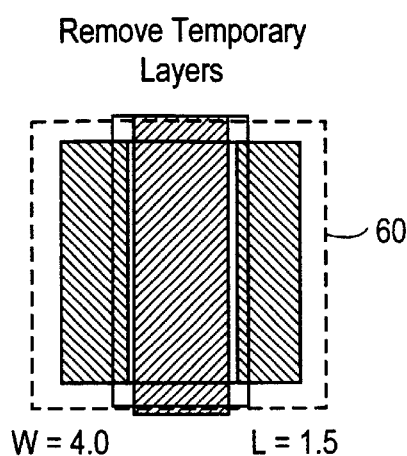
Figure 5E:
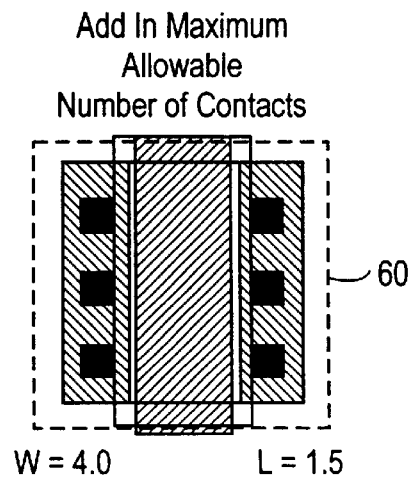

FIG. 5(b) illustrates the horizontal stretching of the device 60 to the specified length of 1.5, while FIG. 5(c) illustrates the vertical stretching of the device 60 to the specified width of 4.0. FIG. 5(d) illustrates the operation of removing temporary layers that were used in the template to designate which areas should be stretched. FIG. 5(e) shows the operation of adding the maximum allowable number of contacts onto the device 60. This is a default operation. Other default operations may be performed. In addition, technology design requirements may be enforced at this time. For example, the device may be re-spaced to insure that a minimum polysilicon width exists.

Figure 5F:
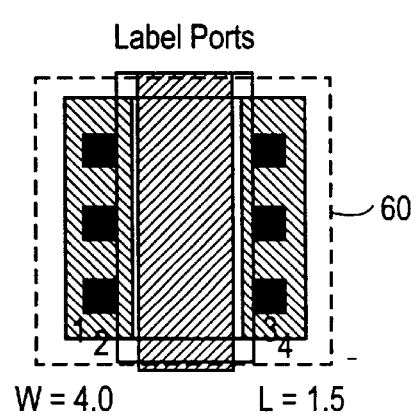
Figure 5G:
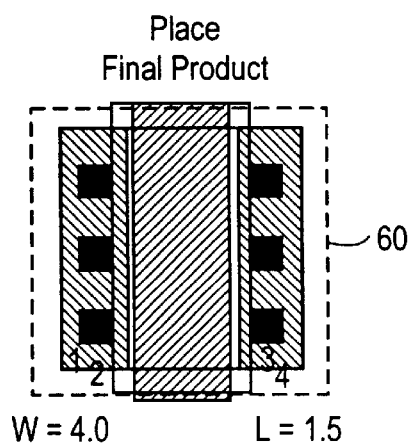

FIG. 5(f) shows the step of labeling the ports. At this point, the processing of step 56 is completed, therefore the physical layout regions of the cell 60 can be drawn (step 58) at the specified location. The final device is shown in FIG. 5(g).

Figure 6:
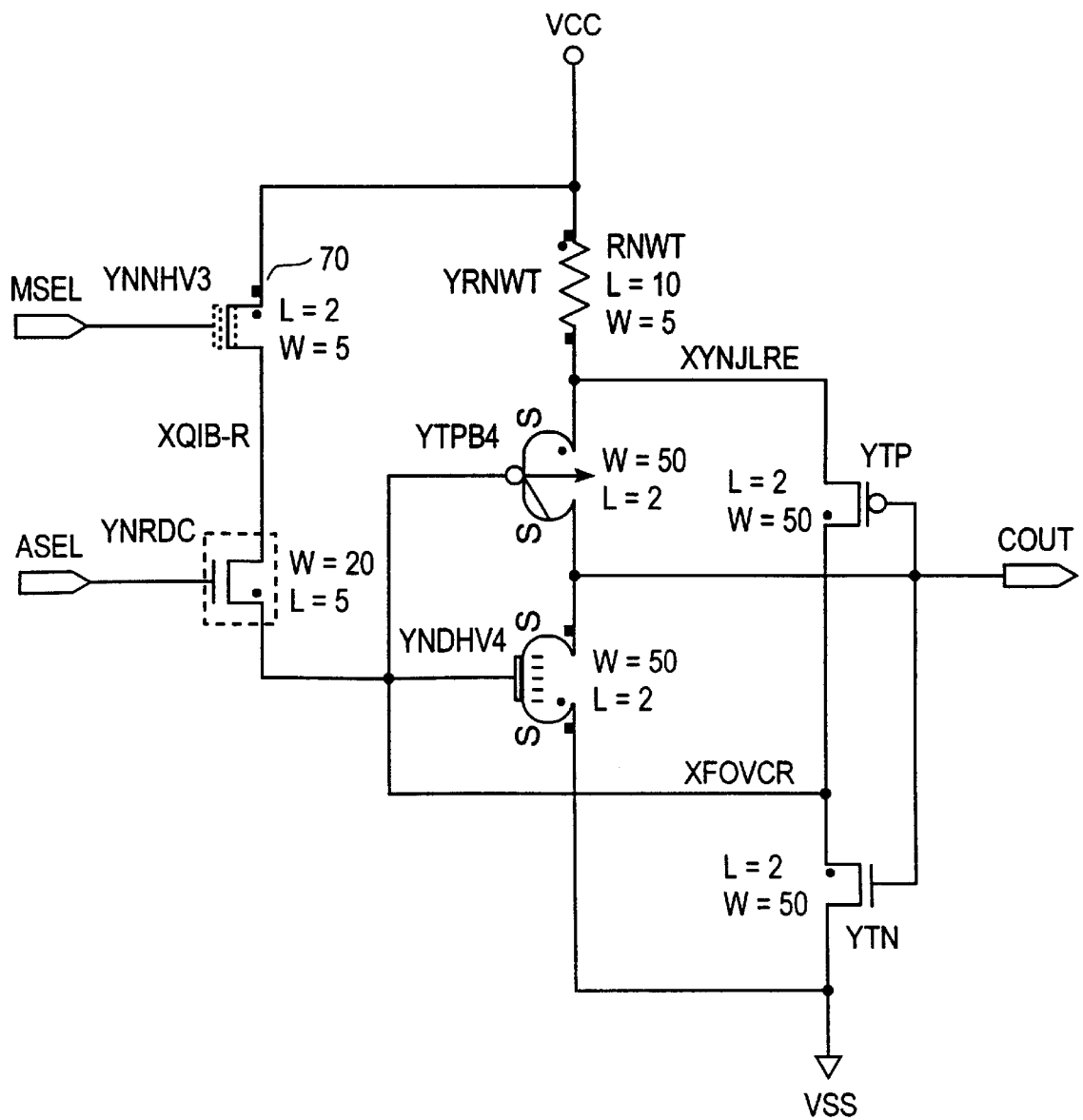
FIG. 6 illustrates a simple circuit schematic that may be processed in accordance with an embodiment of the invention.

FIG. 6 illustrates a schematic that may be processed in accordance with the invention. The following commands, observing the syntax specified above, could be used to generate a layout for the schematic of FIG. 6: devgen NNHV3 5/2 s=Vcc d=XQIB-R g=MSEL inst=YNNHV3 (0,25); devgen NRDC 20/5 s=XQIB-R d=XFOVGR g=ASEL inst=YNRDC (0,15); devgen RNWT 5/10 ra=VCC rb=XYNJLRE inst=YRNWT (10,25); devgen TPB4 50/2 s=XYNJLRE d=COUT g=XFOVGR inst=YTPB4 (10,20); devgen NDHV4 50/2 s=COUT d=VSS g=XFOVGR inst= YNDHV4 (10,10); devgen TP 5/2 s=XYNJLRE d=XFOVGR g=COUT inst=YTP (20,20); and devgen TN 5/2 s=XFOVGR d=VSS g=COUT inst=YTN (20,0).

The first listed command specifies the transistor 70 of FIG. 6. As shown in FIG. 6, and as specified at the command line, this device "NNHV3" has a width of 5 microns, a length of 2 microns, its source is connected to Vcc, its drain is connected to XQIB-R, its gate is connected to MSEL, it is labeled as instance "YNNHV3", and it is positioned at grid location (0,25). The subsequent command lines listed above observe a similar syntax and can also be correlated with the labels of FIG. 6.

Figure 7:
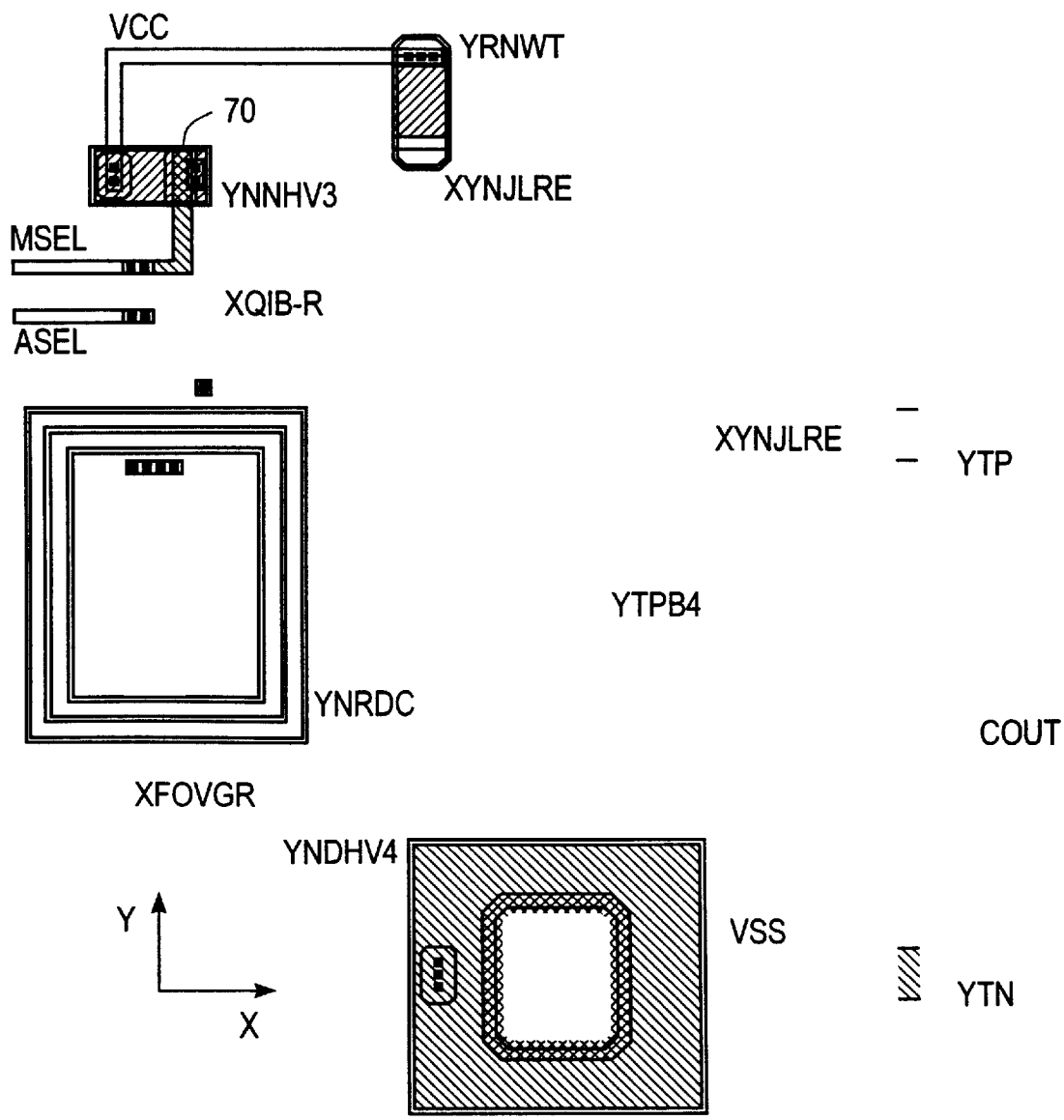
FIG. 7 illustrates a custom physical transistor layout, corresponding to the circuit schematic of FIG. 6, constructed in accordance with the invention.

The physical layout created by the foregoing commands is shown in FIG. 7. The devices and nodes of FIG. 6 can be correlated with the devices and nodes of FIG. 7. For example, FIG. 7 illustrates transistor 70 (the device YNNHV3) with its source connected to Vcc, its gate connected to MSEL, and its drain connected to XQIB-R.

The layout in FIG. 7 includes two complicated looped gate transistors (YTPB4 and YNDHV4). The technology design requirements for these devices are obtained from the design rule library 38. For example, the design rule library 38 will indicate for the looped gate transistor TPB4 that a 5 micron contact to gate spacing on the source and drain is required. FIG. 7 also includes a complicated resistor (YRNWT) and a complex device with a guard ring (YNRDC). The design rule library 38 is used to insure that all technology design requirements are met.

After the physical layout of FIG. 7 has been generated, typically in a layout editor specific file format, it can then be displayed to an output device 26, such as a printer, computer monitor, or plotter for the layout designer to verify or make modifications. Other tools can then be used for determining the best placement and generating interconnect for the newly created devices.

Thus, the invention provides an automated approach to generating custom transistor layouts. The invention reduces design time. Preferably, the cell library includes a large variety of transistors, such as low and medium voltage transistors, high voltage transistors, looped gate transistors, and other special devices. Thus, the invention is distinct from layout tools that are limited to generating standard transistor cells.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

In the claims:

1. A method of automatically generating a custom transistor layout, said method comprising the steps of:

specifying a custom transistor type and an associated set of transistor parameters to characterize a custom transistor with non-standard cell characteristics;

matching said custom transistor type to a custom transistor in a transistor library;

modifying physical layout regions of said custom transistor in accordance with said transistor parameters, said physical layout regions characterizing fabricated integrated circuit components used to implement said custom transistor; and drawing said physical layout regions to form a modified custom transistor with said associated set of transistor parameters, said modified custom transistor forming a portion of a digital circuit.

2. The method of claim 1 wherein said specifying step includes the step of specifying a transistor type selected from the group consisting of a low voltage transistor, a medium voltage transistor, a high voltage transistor, and a looped gate transistor.

3. The method of claim 1 wherein said specifying step includes the step of specifying a transistor parameter including a transistor coordinate position.

4. The method of claim 1 wherein said specifying step includes the step of specifying a set of transistor parameters selected from the group consisting of a transistor instance name, a transistor source name, a transistor gate name, and a transistor drain name.

5. The method of claim 1 wherein said modifying step includes the step of modifying physical layout regions of said custom transistor in accordance with said transistor parameters and technology implementation design requirements.

6. The method of claim 5 wherein said modifying step includes the step of modifying physical layout regions of said custom transistor in accordance with technology implementation design requirements specifying minimum polysilicon width, minimum polysilicon to polysilicon spacing, and minimum polysilicon to diffusion spacing.

7. A circuit designed in accordance with the method of claim 1.

8. A computer readable memory to direct a computer to function in a specified manner, comprising:
 (A) data stored in said memory, said data including:
  (1) a transistor library defining a plurality of custom transistors, and
  (2) a design rule library specifying a set of technology implementation design requirements for said plurality of custom transistors; and
 (B) executable instructions stored in said memory, said executable instructions including:
  (1) first instructions to process a specified custom transistor type and an associated set of transistor parameters to characterize a custom transistor with non-standard cell characteristics,
  (2) second instructions to match said custom transistor type to a selected custom transistor in said transistor library,
  (3) third instructions to selectively modify physical layout regions of said selected custom transistor in accordance with said transistor parameters and technology implementation design requirements, said physical layout regions characterizing fabricated integrated circuit components used to implement said custom transistor, and
  (4) fourth instructions to draw said physical layout regions of said selected custom transistor in accordance with said transistor parameters and technology implementation design requirements, said physical layout regions of said selected custom transistor forming a portion of a digital circuit.

9. The computer readable memory of claim 8 wherein said transistor library includes transistor types selected from the group consisting of a low voltage transistor, a medium voltage transistor, a high volt age transistor, and a looped gate transistor.

10. The computer readable memory of claim 8 wherein said first instructions process a transistor parameter in the form of a transistor coordinate position.

11. The computer readable memory of claim 8 wherein said first instructions process transistor parameters selected from the group consisting of a transistor name, a transistor source name, a transistor gate name, and a transistor drain name.

12. The computer readable memory of claim 8 where in said third instructions include instructions to selectively modify physical layout regions in accordance with technology implementation design requirements specifying minimum polysilicon width, minimum polysilicon to polysilicon spacing, and minimum polysilicon to diffusion spacing.

* * * * *